United States Patent
Wendorf et al.

(10) Patent No.: US 7,197,677 B1
(45) Date of Patent: Mar. 27, 2007

(54) SYSTEM AND METHOD TO ASYNCHRONOUSLY TEST RAMS

(75) Inventors: Kent Wendorf, San Jose, CA (US);
Simon Kwong, San Jose, CA (US);
Alfred Platt, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 276 days.

(21) Appl. No.: 09/940,299

(22) Filed: Aug. 27, 2001

(51) Int. Cl.
*G11C 29/00* (2006.01)
*G06F 11/00* (2006.01)

(52) U.S. Cl. ........................ 714/719; 714/30
(58) Field of Classification Search ............ 714/718, 714/42, 324, 724, 719, 5, 178; 711/104, 711/154, 100; 365/100
See application file for complete search history.

(56) References Cited

U.S. PATENT DOCUMENTS 6,370,661 B1 * 4/2002 Miner ................. 714/718
6,501,690 B2 * 12/2002 Satoh ................. 365/201
2002/0078408 A1 * 6/2002 Chambers et al. ........ 714/718

* cited by examiner

Primary Examiner—Guy Lamarre
Assistant Examiner—John J. Tabone, Jr.
(74) Attorney, Agent, or Firm—Blakely, Sokoloff, Taylor & Zafman LLP

(57) ABSTRACT

A system and method for testing the random access memory of a computer system is disclosed. A memory-testing engine is embedded in the utility bus controller of an application specific integrated circuit, which is coupled to a random access memory in need of testing. Upon receiving an initiation signal over a bus from the central processing unit, the memory-testing engine begins writing data to a targeted area of the memory, and then reading back the stored data and comparing the data to what was sent. Having the memory-testing engine distributed to the memory's being tested allows several memory devices to be tested simultaneously.

36 Claims, 4 Drawing Sheets

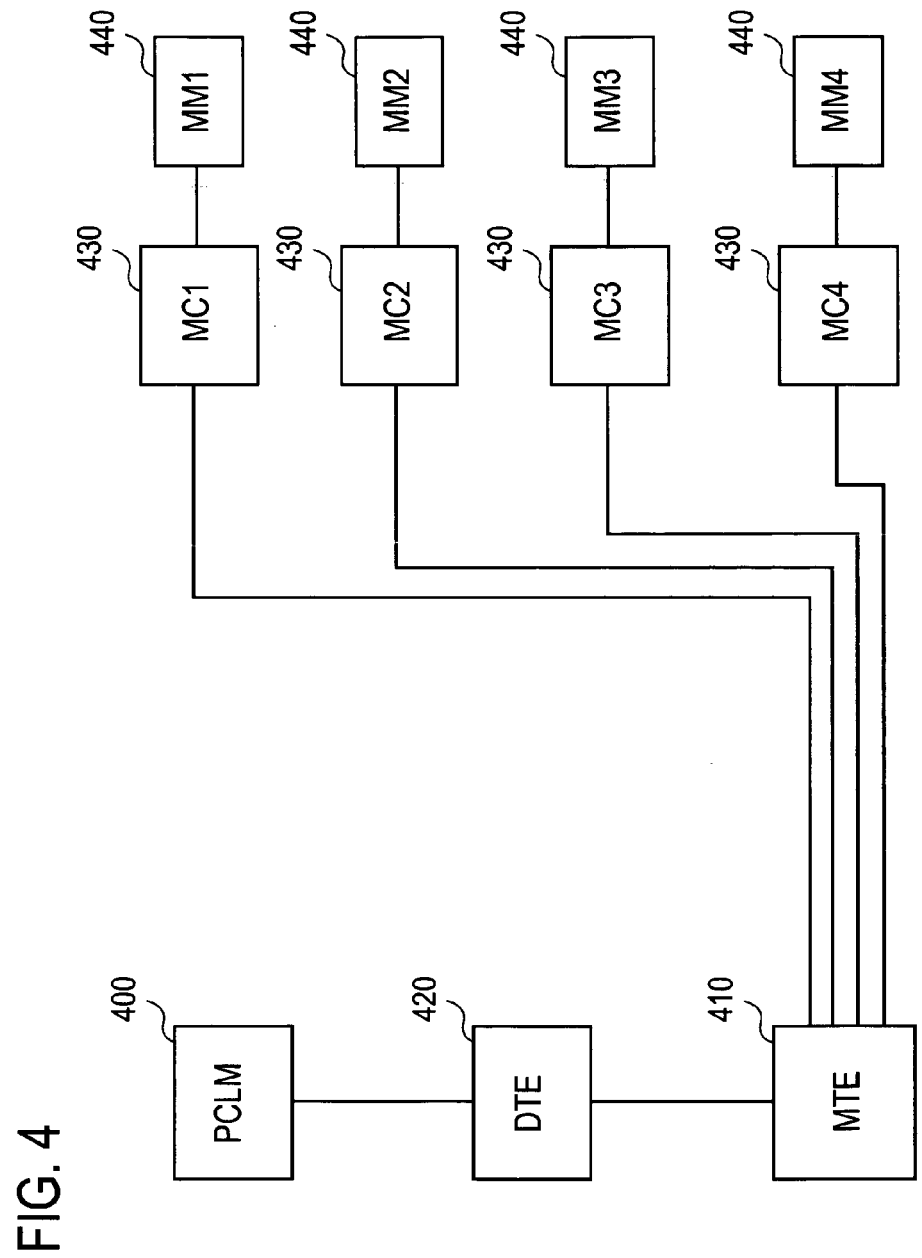

SYSTEM AND METHOD TO ASYNCHRONOUSLY TEST RAMS

FIELD OF THE INVENTION

The field of the invention relates to testing random access memory devices.

BACKGROUND OF THE INVENTION

Reliability of hardware is highly dependent upon the extent of random access memory (RAM) testing that is performed before shipping the product. In order to provide maximum coverage for external memory attached to application specific integrated circuits (ASIC) as well as ASIC internal memories, previous wide area network (WAN) switches have relied on the use of the embedded processor to test each RAM and each memory location. The quality of RAM test coverage goes up with each location tested and with multiple data patterns per location. This conventional approach is very time consuming because the processor has to synchronously execute the diagnostic program that requires several instructions and memory fetches per address location tested. The length of time used to completely test a board is exacerbated by the cost of the test fixture environment. The advent of large asynchronous transfer mode (ATM) switches compounds the problem with the switch's vast array of internal and external memories.

SUMMARY OF THE INVENTION

A system is described that includes a first application specific integrated circuit. The system also includes a first random access memory coupled with the first application specific integrated circuit. A first memory testing engine executes test operations on the random access memory. A first bus slave controller operates the memory testing engine. A processor controls the bus slave controller, with a bus connecting the two.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicated similar elements and in which:

FIG. 4 illustrates an alternative system architecture of the present invention.

DETAILED DESCRIPTION

A system and method are described for testing the random access memory of a computer system. The embodiments circumvent the time and efficiency problems inherent in testing by moving the testing procedure from a centralized testing system that must individually test each of the RAM's associated with the ASIC's to a memory testing engine (MTE) embedded on or coupled with the bus slave controller on each integrated circuit. This allows the testing to be performed on each RAM at once, reducing the time cost of testing each individual RAM. Additionally, by embedding the MTE in the bus slave controller, the amount of equipment needed to test the machinery can be reduced, increasing both fiscal and spatial efficiency. The efficiency is increased by shortening the path that the data has to travel, allowing the memory tests to be run concurrently, and freeing the processor to perform other functions. The speed, efficiency, and decentralized nature of the MTE will enhance field-testing of memory modules as well.

Figure 1:
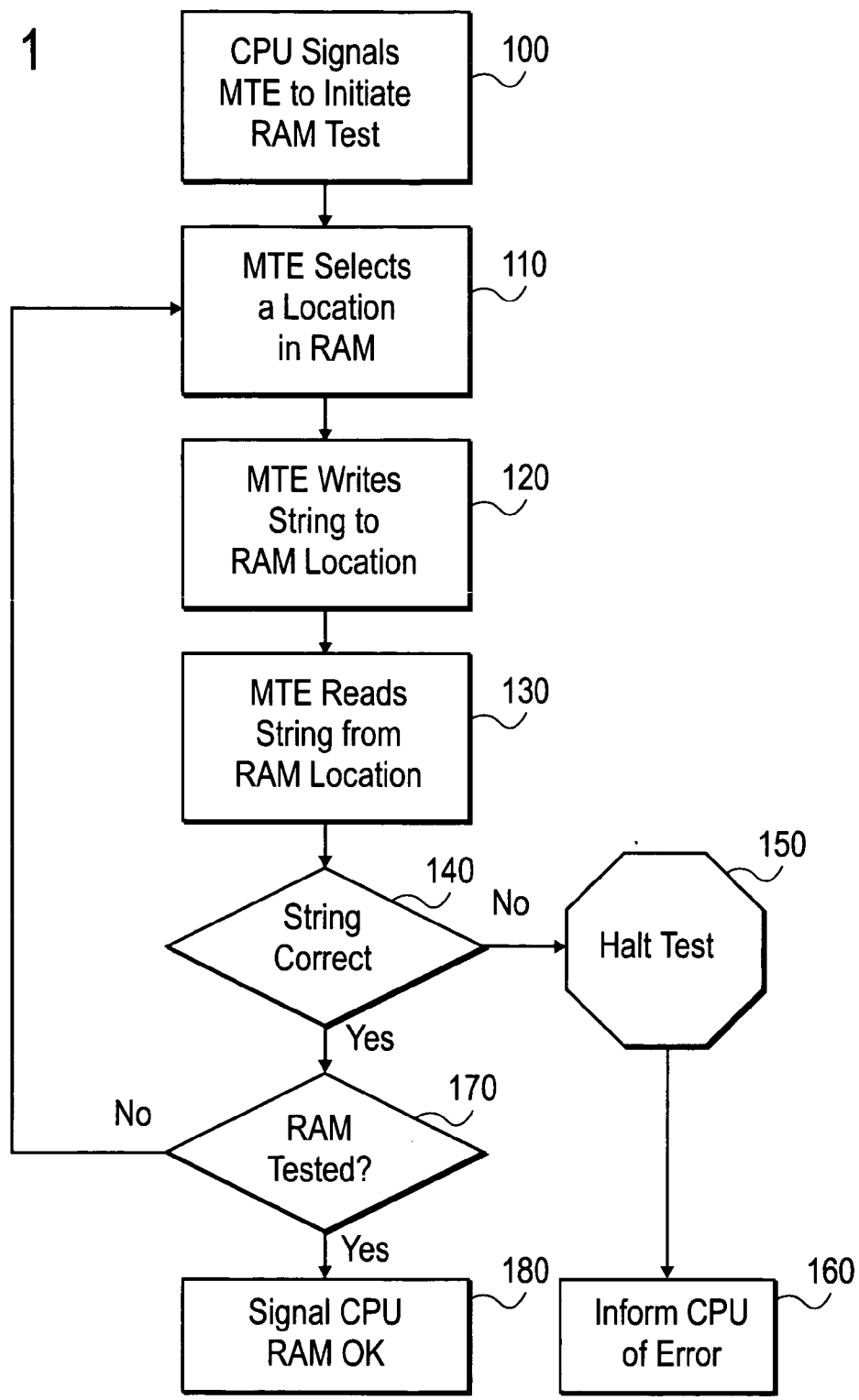
FIG. 1 illustrates in a flowchart the method for testing random access memory.

One embodiment of the method that may be used for testing is illustrated in the flowchart of FIG. 1. The CPU would signal the memory test engine embedded in the bus slave controller to initiate a RAM test 100. The MTE selects a location in the RAM to test 110, and then writes a string of data to that location 120. The MTE then reads that string back from memory 130 and sees if it matches what was written 140. If the string does not match, the test is halted 150 and the CPU is informed of the error 160. If the string does match, and the RAM has been completely tested 170, the CPU is informed that the RAM is error free 180. If the RAM is not completely tested, a new location is selected 110 and the process is repeated.

Figure 2:
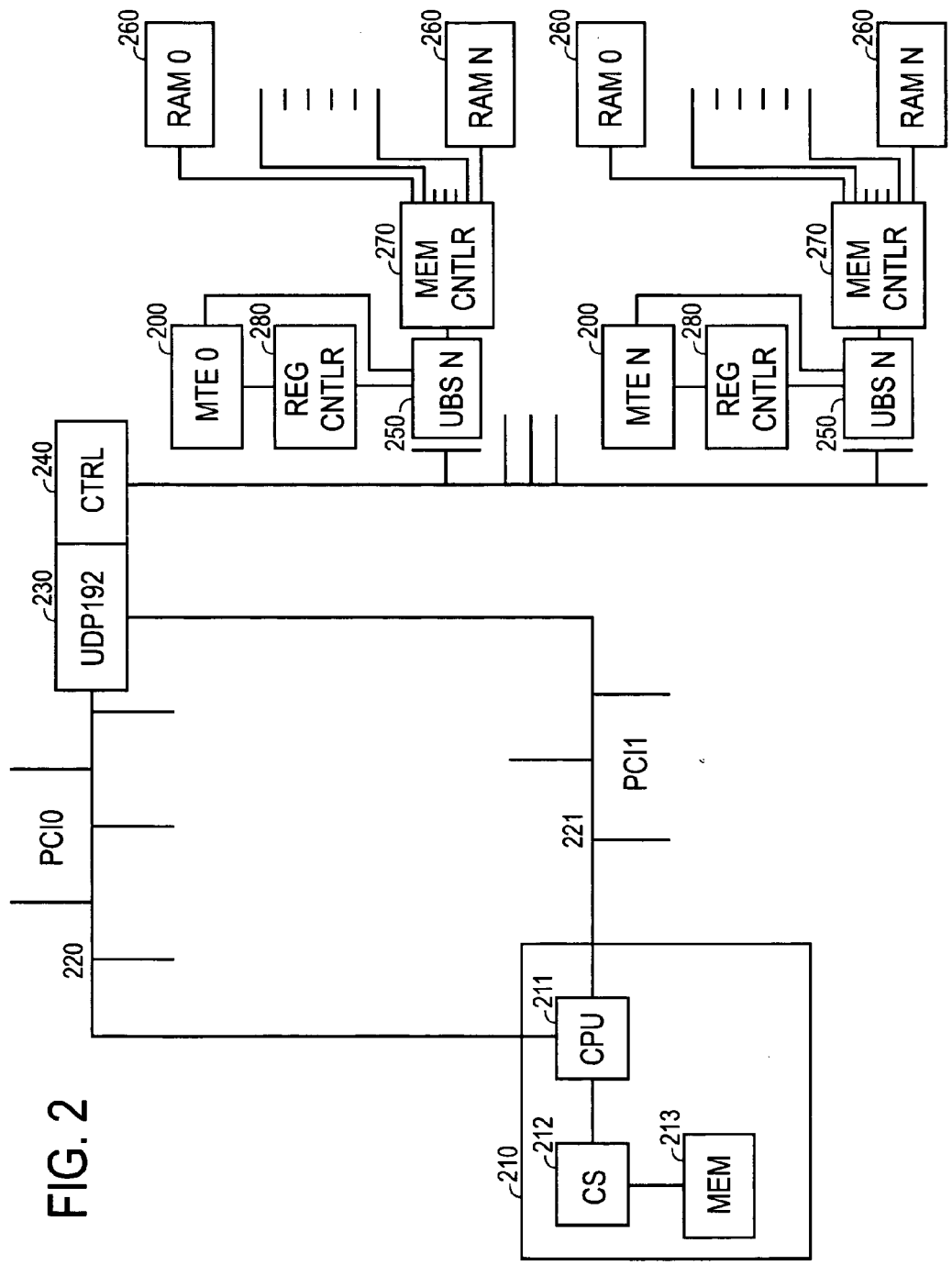
FIG. 2 illustrates the circuit design of the memory test engine.

An exemplary embodiment of the MTE 200 within a utility bus system is displayed in FIG. 2. A central processing unit (CPU) daughter card 210 communicates over the protocol control information (PCI) bus 220. For one embodiment, the CPU daughter card contains a CPU 211, a chip set 212, and a memory storage device 213. For another embodiment, the PCI proprietary bus may have a PCI communications link (PCL) (PCI 0 message) 220 or Utility Bus (PCI 1 message) 221. The PCI bus accesses a series RAM's to be tested via a translator 230, such as a Utopia Data Path 192 (UDP192) chip. The translator 230 would give the daughter card access to a master bus controller 240 and a series of utility bus slave (UBS) controllers 250. In one embodiment, the translator 230 provides access to a master bus controller 240 and eight UBS controllers 250. In an alternate embodiment, each UBS controller 250 contains the functionality of a translator 230 and master bus controller 240, allowing the PCI bus 220 to communicate directly. Each UBS controller 250 is coupled to a RAM or series of RAMs 260 via a memory controller 270. For one embodiment, the RAM 260 can be either a static RAM (SRAM) or a synchronous dynamic RAM (SDRAM). For a further embodiment, each UBS controller 250 contains a MTE 200, which may be embedded within the UBS controller 250, or separately coupled to the UBS controller 250 via a register controller 280. Either arrangement allows for the MTE 200 to utilize the data, address, and control pathways used by the UBS controller 250. Control of these pathways is passed between the MTE 200 and the UBS controller 250 so that only one of these entities has control at a one time. For example, if data traffic is being passed to the memory modules by the UBS controller, the MTE 200 cannot run a test function. In one embodiment, a bit register tracks whether the MTE 200 or the UBS controller 250 has control of the pathways.

Figure 3:
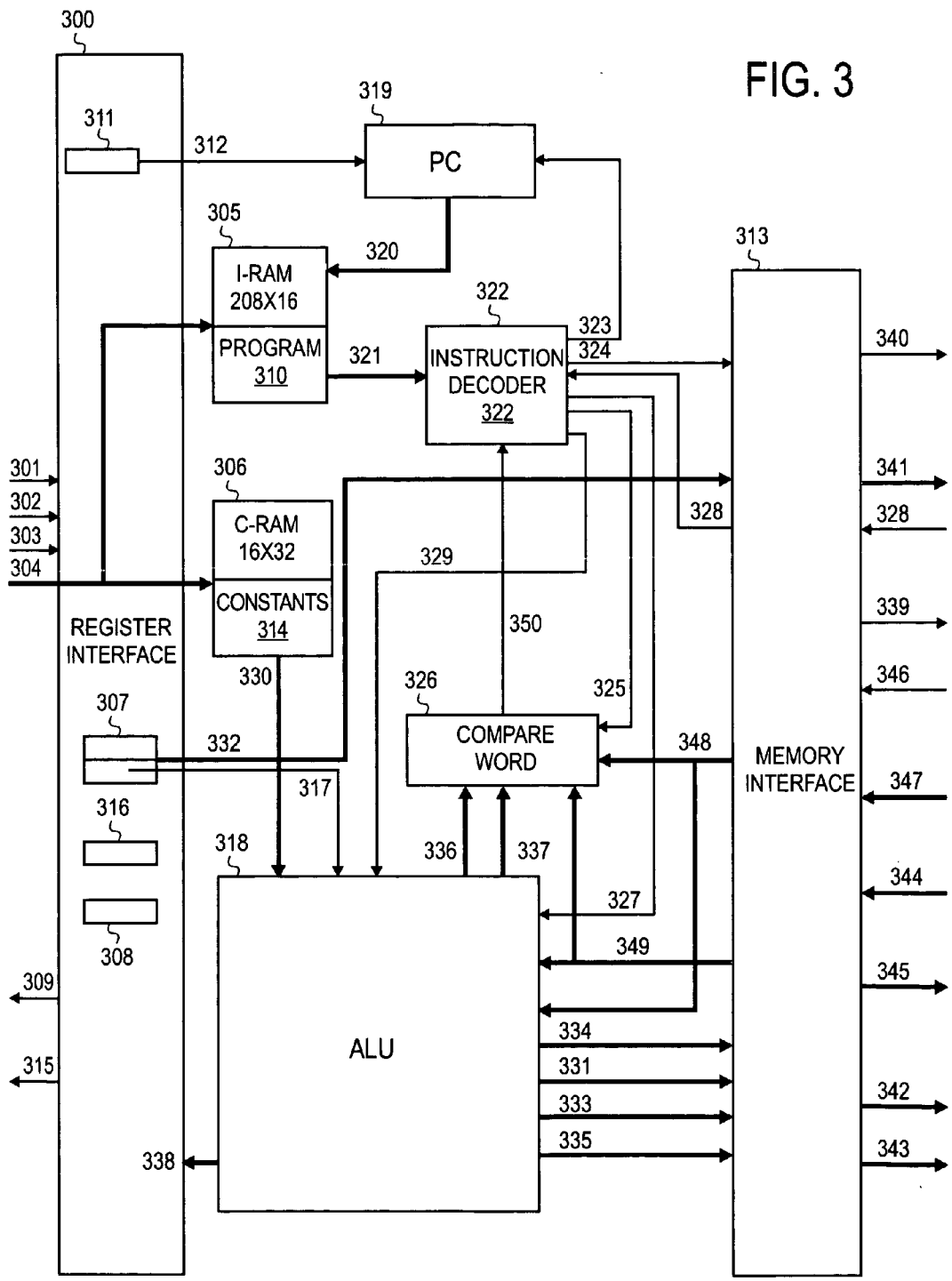
FIG. 3 illustrates the system architecture of the present invention.

For one embodiment, the MTE 200 architecture would be constructed as illustrated in FIG. 3. The processor configures the MTE 200 through write messages to the translator chip over one of the proprietary busses. The translator chip relays the message and translates the protocol between the proprietary buses to the MTE. These translated messages are seen by the MTE register interface logic 300 as register requests 301 with the register write 302 indication active. Associated with the register write request from the UBS controller 250, in one embodiment, is a register address 303 and register write data 304. The MTE register interface 300 decodes the register address 303 and writes the register write data 304 to the location indicated by the register address 303; for example an Instruction RAM (I-RAM) 305 word or a Constants RAM (C-RAM) 306 word whose RAMs have dedicated write interfaces with the Register Interface 300. Other writeable registers include a Control Register 307, and an Interrupt Enable register 308. The MTE register interface logic 300 acknowledges a register-write request by asserting a register data acknowledgement 309 and thereby releasing the utility bus slave controller to accept a new bus message.

Using the methods described, the processor writes the MTE's micro-coded RAM test program 310 to the I-ram 305. The program needs to be loaded only once after power up. The MTE Enable Register 311 is written to disable the MTE by de-asserting the enable signal 312, which resets the program counter 319. The Enable Register 311 is then rewritten to enable the MTE, asserting the enable signal 312 to the UBS controller, which gives the MTE use of the memory interface 313. The MTE C-RAM 306 is written with the constants 314 necessary to tailor the test to the configuration of a particular RAM. Typically, the MTE Interrupt Mask Register 308 is configured to enable interrupts to the processor via the interrupt signal 315 for conditions indicated in the MTE Status Register 316, such as "Test completed successfully" or "Test failed". Finally, the Control Register 307 is written with the Target ID that indicates which RAM to be tested and a start bit 317 that triggers operation of the MTE Arithmetic Logic Unit (ALU) 318.

The program counter 319 sends an address 320 to the I-RAM 305. The I-RAM 305 having received the address 320 sends and instruction 321 to the instruction decoder 322. The instruction decoder 322 sends increment/load/call/return signals 323 to the program counter 319. The instruction decoder 322 can send a write signal 324 to the memory interface 313. The instruction decoder 322 may also send out a disable mask signal 325 to the word comparator 326 or a complement signal 327 to the ALU 318. The Memory Interface relays the memory done signal 328 which the instruction decoder 322 uses to determine in conjunction with state information, to send a completion signal 329 to the ALU 318.

The C-RAM sends the raw expected data 330, the initial address, and the data word mask to the ALU 318.

The ALU 318 processes the commands from the Instruction Decoder 322 and the operands from the C-RAM 306 to validate a memory request 331 to the memory interface 313. The Memory Interface consists of the write signal 324 (to indicate a read or a write), the RAM target 332 (to specify a RAM), the memory address 333, the write data 334, and the length (number of words associated with the request) 335. The ALU also sends the final read data word mask 336 and expected read word 337 to the Compare Word 326 logic block. Additionally, the ALU 318 sends the register read data 338 to the register interface 300.

The memory interface 313 connects the MTE to the memory controller 270, which is shared with the UBS controller 250. The memory interface 313 accommodates communication between the MTE and different interfaces to memory controller 270 (as used in a Utility Bus Slave) or memory controller 430 (as used in a PCL bus configuration, see FIG. 4). The ALU 318 generates a data pattern to write to memory and sends memory request 331, the write memory signal 324, the RAM target 332, the memory address 333, the write data 334, and the request length 335 to the memory interface 313. The data is accumulated in a memory interface data buffer. The memory interface sends a memory request 339, the memory write signal 340, a memory target 341, memory address 342, and memory length 343 to the memory controller 270/430. The memory controller 270/430 sees the request and responds by reading the data from the buffer in the memory interface 313. The data from the memory interface buffer 313 is read by sending the initial word address on the data word select signals 344. After a fixed latency, the memory controller 270/430 can sample the memory write data 345. The memory controllers advances the data word select 344 at the fastest rate that it can receive data. When the memory controller 270/430 has transferred the number of words satisfying the length 343, the memory controller 270/430 asserts the memory done signal 328. The memory interface 313 signals done to the instruction decoder 322 which allows it to continue to generate the next data pattern to be write, or to read the data back for comparison, as dictated by the program stored in the I-RAM 305.

Generally, the next instruction would generate a read request to the same memory target and location as seen by the assertion of the memory request 331, the de-assertion of the memory write signal 324, the same indication of the memory target 332, memory length 335, and memory address 333, as on the previous write request. The memory interface relays the message by asserting memory request 339 along with the de-assertion of the memory write signal 340, the memory target 341, the memory address 342, and the memory length 343 to the memory controller 270/430. The memory controller 270/430 signals memory read data valid 346, memory data word select 344, and the memory read data 347. The memory interface 313 passes the read data 348 and read data 349 valid to the word comparator 326 and the ALU 318. The word comparator 326 compares the read data 348 with the expected read word 337. If they match, a compare equal 350 is sent to the instruction decoder 322. The data word select incrementing while the data is returned until the requested read request length is satisfied, at which time the memory done signal 328 is asserted. The memory interface 313 signals the instruction decoder 322 that the data transfer is complete.

The instruction decoder generates the controls to compare the received memory data to the expected pattern. If the data does not match what is expected, an error bit is set in the interrupt to the MTE status register 316 and processing is terminated. If the corresponding mask bit is set in the interrupt mask register 308, an interrupt signal 315 is asserted to alert the processor. If the data does match what is expected, the address is incremented, a data pattern is generated and a new memory write request is made to the memory interface 313. This process continues until an error is detected or the RAM has been completely tested. At that time, completion status can be written to status register 316 which, if the corresponding mask bit is set in the interrupt mask register 308, will cause the interrupt signal 315 to signal the processor.

In an additional embodiment, the Current Memory Address Register, the Current Memory Data Expected Register, the Current Compare Word Mask Register, and the Current Memory (actual) Data Register are all implemented in the MTE and are processor accessible to identify a failing RAM location and data pattern.

FIG. 4 illustrates an alternate embodiment in which the MTE is deployed into a non-utility bus system. A PCI Communications Link Master (PCLM) 400 accesses and controls the MTE 410 via a Data Transfer Engine (DTE) 420. The MTE 410 conducts in a memory controller (MC) 430 a memory test for a RAM module (MM) 440. For one embodiment, the MTE runs tests in a series of memory controllers coupled with memory modules. The MTE 410 is able to interface with the memory controllers 430 at a specific bandwidth, which is translated by the controllers 430 into the bandwidth required by the memory modules 440. The MTE can use data, control and address pathways independent of the DTE, or can be integrated into the DTE and use the same pathways.

The method and apparatus disclosed herein may be integrated into advanced Internet- or network-based knowledge systems as related to information retrieval, information extraction, and question and answer systems.

The method described above can be stored in the memory of a computer system (e.g., set top box, video recorders, etc.) as a set of instructions to be executed. The instructions to perform the method described above could alternatively be stored on other forms of machine-readable media, including magnetic and optical disks. For example, the method of the present invention could be stored on machine-readable media, such as magnetic disks or optical disks, which are accessible via a disk drive (or computer-readable medium drive). Further, the instructions can be downloaded into a computing device over a data network in a form of compiled and linked version.

Alternatively, the logic to perform the methods as discussed above, could be implemented by additional computer and/or machine readable media, such as discrete hardware components as large-scale integrated circuits (LSI's), application-specific integrated circuits (ASIC's), firmware such as electrically erasable programmable read-only memory (EEPROM's); and electrical, optical, acoustical and other forms of propagated signals (e.g., carrier waves, infrared signals, digital signals, etc.); etc.

Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A system, comprising:
   a bus;
   a first random access memory (RAM);
   a first memory testing engine (MTE) to execute test operations on the first random access memory;
   a first bus controller for the bus, and in which the first memory testing engine is integrated to have a first memory interface which is shared with the first memory testing engine to access the first RAM;
   a second RAM;
   a second MTE to execute test operations on the second RAM;
   a second bus controller for the bus, and in which the second MTE is integrated to have a second memory interface which is shared with the second MTE to access the second RAM; and
   a processor;
   wherein each bus controller is to provide the processor access to random access memory via its respective memory interface, and the processor is to control the each memory testing engine via the bus and the respective bus controller and wherein each memory testing engine uses data, address and control pathways used by its respective bus controller so that if normal data traffic from the processor is being passed to a memory module by the respective bus controller, its integrated memory testing engine cannot run a test function.

2. The system of claim 1, wherein the first and second memory testing engines can perform testing operations concurrently.

3. The system of claim 1, wherein the first memory testing engine generates test data and expected responses.

4. The system of claim 3, wherein the first memory testing engine captures and compares an actual random access memory response to the test data.

5. The system of claim 1, wherein the first memory testing engine is responsible for programmable address ranges and data widths.

6. The system of claim 1 further comprising a register controller for the processor to configure the first memory testing engine.

7. The system of claim 1, wherein the first memory testing engine saves a failing address for the processor.

8. The system of claim 1, wherein the first memory testing engine saves a failing data value for the processor.

9. The system of claim 1, wherein the first memory testing engine discontinues an active test until the processor reads a failing address and a memory address location.

10. The system of claim 1, wherein the first memory testing engine reports an asynchronous interrupt to the processor.

11. A method, comprising:
    transmitting a plurality of initiation signals from a processor via a bus to a plurality of memory testing engines via a plurality of bus controllers, respectively, for the bus;
    testing a plurality of random access memories, respectively, using the plurality of initiated memory testing engines, respectively;
    accessing from the processor through the bus normal data traffic to and from the plurality of random access memories via the plurality of bus controllers, respectively;
    accessing from the bus controllers the random access memories using a plurality of memory controllers, respectively; and
    passing control of data, address and control pathways between (1) each one of the memory test engines, and (2) a respective one of the bus controllers, so that only one of the two has control at one time.

12. The method of claim 11, further comprising transmitting data traffic from the processor through the bus to one of the random access memories via the data, address and control pathways while such are under control of the respective bus controller.

13. The method of claim 11, further comprising generating test data and expected responses.

14. The method of claim 13, further comprising capturing and comparing an actual random access memory response to the test data.

15. The method of claim 11, wherein testing comprises writing multiple data patterns per memory location within a random access memory and comparing a reading of the location with an expected response.

16. The method of claim 11, further comprising:
    configuring the memory test engines using a plurality of register controllers, respectively.

17. The method of claim 11, further comprising saving a failing address for the processor.

18. The method of claim 11, further comprising saving a failing data value for the processor.

19. The method of claim 11, further comprising discontinuing an active test until the processor reads a failing address and a memory address location.

20. The method of claim 11, further comprising reporting an asynchronous interrupt to the processor.

21. A machine-readable storage medium tangibly embodying a sequence of instructions executable by a machine to perform a method comprising:
 accessing over a bus normal data traffic to and from each of a plurality of memories that is associated with a respective one of a plurality of ASICs, via a respective one of a plurality of utility bus slave (UBS) controllers on the respective ASIC;
 configuring each of a plurality of memory test engines (MTEs) that is integrated in the respective UBS controller to have the same memory interface to said memory, by writing to a respective one of the UBS controllers over said bus; and
 processing a signal from each of the MTEs that a test of its respective memory is complete.

22. The machine-readable storage medium of claim 21, further comprising instructions that when executed control the capturing and comparing of an actual random access memory response to the test data.

23. The machine-readable storage medium of claim 21, wherein the instructions are such that the test comprises writing multiple data patterns per memory location within the memory and comparing a reading of the location with an expected response.

24. The machine-readable storage medium of claim 21, further comprising instructions that when executed configure each of the METs by writing to a respective register controller.

25. The machine-readable storage medium of claim 21, further comprising instructions that when executed test memory in a decrementing memory address order.

26. The machine-readable storage medium of claim 21, further comprising instructions that when executed save a failing address for a processor.

27. The machine-readable storage medium of claim 21, further comprising instructions that when executed save a failing data value for a processor.

28. The machine-readable storage medium of claim 21, further comprising instructions that when executed discontinue an active test until a processor reads a failing address and a memory address location.

29. The machine-readable storage medium of claim 21, further comprising instructions that when executed report an asynchronous interrupt to a processor.

30. An apparatus comprising:
 first means for testing a first memory;
 second means for testing a second memory wherein the first and second memory are to be tested at once by the first and second testing means;
 first means for controlling a bus and accessing the first memory, the first testing means being integrated in the first bus controlling means to share the same memory interface;
 second means for controlling the bus and accessing the second memory, the second testing means being integrated in the second bus controlling means to share the same memory interface;
 means for initiating testing by the first and second testing means, by accessing each testing means over the bus and via its respective bus controller means; and
 means for disabling each testing means while passing normal data traffic from the initiating means to the respective memory over the bus.

31. The apparatus of claim 30, further comprising a means for generating test data and expected responses.

32. The apparatus of claim 31, further comprising a means for capturing and comparing an actual random access memory response to the test data.

33. The apparatus of claim 30, further comprising a means for saving a failing address for the initiation means.

34. The apparatus of claim 30, further comprising a means for saving a failing data value for the initiation means.

35. The apparatus of claim 30, further comprising a means for discontinuing an active test until the initiation means reads a failing address and a memory address location.

36. The apparatus of claim 30, further comprising a means for reporting an asynchronous interrupt to the initiation means.

* * * * *